June 17, 1941. N. P. CASE Re. 21,826

CONTROL NETWORK

Original Filed Feb. 11, 1938

INVENTOR
NELSON P. CASE
BY Laurence B. Dodds
ATTORNEY

Reissued June 17, 1941

Re. 21,826

UNITED STATES PATENT OFFICE 21,826

CONTROL NETWORK

Nelson P. Case, Great Neck, N. Y., assignor to Hazeltine Corporation, a corporation of Delaware Original No. 2,197,516, dated April 16, 1940, Serial No. 189,992, February 11, 1938. Application for reissue May 16, 1940, Serial No. 335,617

8 Claims. (Cl. 250—20)

Figure 2:
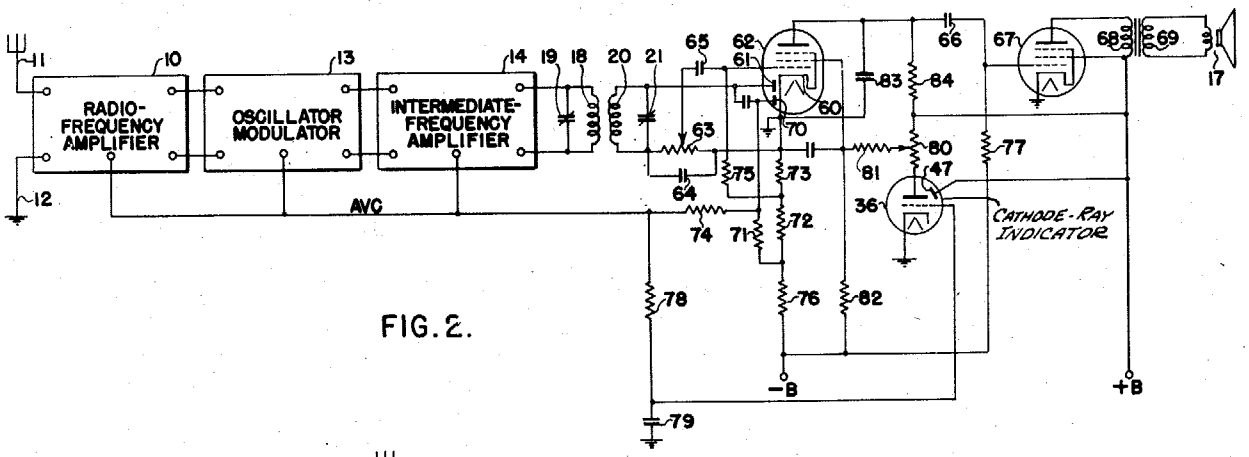

This invention relates generally to a control network for modulated-carrier signal receivers and particularly to a silencing network to be utilized in a receiver including a tuning indicator such as the cathode-ray tuning eye. Also, the invention is particularly suitable for use in a receiver in which a plurality of vacuum tubes in the signal-translating channel of the receiver have their cathodes directly grounded.

It is desirable to incorporate in certain radio receivers both a visual tuning indicator and an arrangement for silencing the receiver during the intervals when the receiver is mistuned, to prevent distorted signals and noise from being reproduced. Many such silencing networks are known, the use of which is attended by certain disadvantages. One of the disadvantages of the prior art silencing networks is that they have generally utilized at least one additional vacuum tube or its equivalent.

There is no potential available in the conventional radio receiver suitable to be utilized as a silencing voltage for the receiver without further amplification. Furthermore, the silencing means previously utilized have generally been more responsive to strong signals than to weak ones, the receiver being silenced for a lesser degree of mistuning when weak signals are being received.

One silencing network which has been used commercially comprises a first audio-frequency amplifier having a normal cathode potential several volts above ground and a silencing network coupled to the signal channel of the receiver at a point preceding the first audio-frequency amplifier. This silencing network comprises a direct current amplifier having a grounded cathode for amplifying the automatic amplification control voltage of the receiver to provide a silencing voltage for the first audio-frequency amplifier tube. The silencing voltage thus provided is applied positively to the control grid of the first audio-frequency amplifier, but is of such value that the bias of the control grid is not raised above its normal cutoff value except when the receiver is properly tuned. However, with the arrangement just described in a receiver having an alternating current power supply, difficulties are encountered in that audio-frequency currents are introduced in the audio-frequency channel of the receiver due to the fact that an appreciable potential exists between the cathode heater of the first audio-frequency amplifier, which is usually at ground potential, and its cathode which, as stated above, is several volts above ground. As there is a relatively high amplification in the signal-translating channel of the receiver succeeding the point at which these alternating potentials are introduced, difficulty is experienced in preventing a low-frequency hum in the loud-speaker of the receiver. If the same type of silencing network is utilized in a receiver having the cathode of the first audio-frequency amplifier grounded, it follows that the cathode of the amplifier which amplifies the automatic volume control potential is several volts below ground potential. Thus, in the conventional receiver circuit, the automatic amplification control source must provide potentials more negative than the cathode of the amplifier tube which provides the silencing potential. Further, the cathodes of the tubes of the signal-translating channel of the receiver preceding the point from which the automatic amplification control potential is derived must also be more negatively biased, a condition which is obviously undesirable.

It is an object of the invention to provide an improved and economical control network for modulated-carrier signal receivers.

It is an object of the invention to provide a simple and economical silencing arrangement for a modulated-carrier signal receiver comprising a cathode-ray tuning indicator.

It is a further object of the invention to provide a signal receiver including a silencing network having a substantially uniform response to received signals of varying intensity.

It is another object of the invention to provide a sharply selective silencing network for a signal receiver to ensure silencing except when the receiver is precisely tuned.

In accordance with the present invention, there is provided a modulated-carrier signal receiver, which may be of the superheterodyne type, including an automatic amplification control system for maintaining the signal amplitude at a given point in the receiver, for example, at a point in the intermediate-frequency channel, within relatively narrow limits. A limiter-amplifier is coupled to this point for deriving a signal substantially free from residual variations in amplitude, the limiter-amplifier including a sharply-selective circuit tuned to the signal-carrier frequency and following the point at which limiting occurs. There is also provided means including a rectifier coupled to the limiter-amplifier for deriving a potential to silence the receiver. In a preferred embodiment of the invention, the receiver includes a cathode-ray tuning indicator which is also utilized for amplifying the silencing bias voltage derived from the signal-translating channel of the receiver.

In accordance with a feature of the invention, there is provided in a carrier-signal receiver a control network comprising means for receiving a carrier-frequency signal, an amplitude-limiter for limiting to a substantially constant value the maximum amplitude of signals translated thereby, a rectifier, and a circuit sharply-selective to the carrier-frequency signal and coupling the limiter to the rectifier. The control network also comprises means for applying the carrier-frequency signal to the limiter and rectifier, means for deriving directly from the rectifier a unidirectional control voltage for the receiver which is substantially free from residual variations in amplitude, and means for utilizing the control voltage to control an operating characteristic of the receiver.

As used herein, the term "limiter-amplifier" refers to an amplifier which is operated beyond both an upper and a lower cutoff point, so that signal inputs of all amplitudes in excess of a predetermined value transmitted by the amplifier develop output signals of constant amplitude; for example, the term may refer to a vacuum-tube amplifier adapted to operate over its entire grid-voltage plate current characteristic curve between negative grid-bias cutoff and the grid current point.

For a better understanding of the invention, together with other and further objects thereof, reference is had to the following description taken in connection with the accompanying drawing, and its scope will be pointed out in the appended claims.

Figure 1:
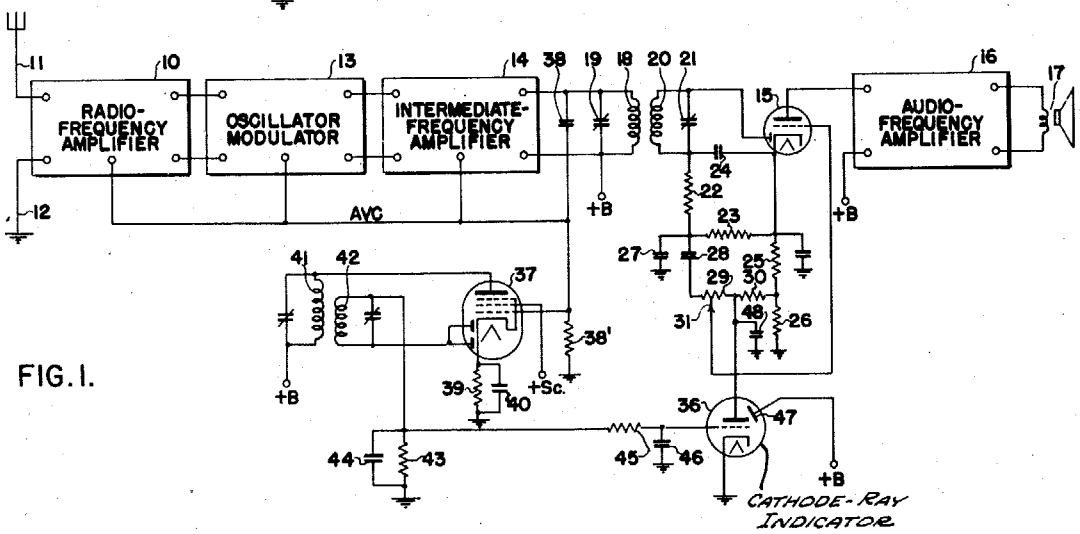

In the drawing, Figs. 1 and 2 are circuit diagrams, partly schematic, of complete superheterodyne receivers embodying different forms of the invention.

Referring now more particularly to Fig. 1 of the drawing, there is shown schematically a complete superheterodyne radio receiver of a conventional design embodying the present invention in a preferred form. In general, the receiver includes a radio-frequency amplifier 10 having its input circuit connected to an antenna 11 and ground 12 and its output circuit connected to an oscillator-modulator or frequency changer 13. Connected in cascade with frequency changer 13, in the order named, are an intermediate-frequency amplifier 14 of one or more stages and a duplex diode-triode vacuum tube 15, the diode section of which is the detector of the receiver and the triode section of which is the first audio-frequency amplifier of the receiver. The detector section of tube 15 is coupled to the output circuit of intermediate-frequency amplifier 14 through a double-tuned intermediate-frequency selector 18—19—20—21. A load circuit is provided for the detector comprising resistors 22 and 23 by-passed for carrier-frequency currents by condensers 24 and 27. Cathode-biasing resistors 25 and 26 are provided for vacuum tube 15. Audio-frequency potentials are derived from an adjustable voltage divider across resistor 23, comprising blocking condenser 28, adjustable tapped resistor 29, resistor 30, and by-pass condenser 48, by way of a volume control tap 31 on resistor 29, and are applied to the grid of the triode section of the tube 15 in a conventional manner.

It will be understood that the various circuits just described may be of conventional construction and operation, the details of which are well known in the art, rendering further description thereof unnecessary. Considering briefly the operation of the receiver as a whole and neglecting for the moment the silencing network of this invention presently to be described, a desired received signal intercepted by antenna 11 is selected and amplified by radio-frequency amplifier 10, is converted to a modulated intermediate-frequency carrier in frequency changer 13, is amplified and selected by intermediate-frequency amplifier 14, and rectified by the diode section of tube 15, thereby deriving the audio frequencies of modulation and the automatic amplification control bias. The audio-frequencies of modulation are, in turn, amplified by the triode section of tube 15 and by audio-frequency amplifier 16 and are reproduced by sound reproducer 17.

Referring now more particularly to the parts of the system involving the present invention, there is provided a means for developing an automatic amplification control bias for the receiver, for operatively exciting a cathode-ray tuning indicator or tuning eye 36, and for developing a voltage for silencing the receiver during tuning thereof or when mistuned. A voltage derived from the intermediate-frequency channel of the receiver is amplified to a constant value by limiter-amplifier 37 having its control grid coupled to the output circuit of intermediate-frequency amplifier 14 through condenser 38. An automatic amplification control bias derived from grid leak 38′ is applied to the control electrodes of one or more of the tubes of radio-frequency amplifier 10, oscillator-modulator 13, and intermediate-frequency amplifier 14 to maintain the signal input to the detector within a relatively narrow range for a wide range of received signals. A cathode-biasing resistor 39, by-passed by condenser 40, is provided for limiter-amplifier 37. The output circuit of limiter-amplifier 37 is coupled through a sharply tuned loosely-coupled transformer 41, 42 to a diode section in limiter-amplifier 37 provided with a load circuit comprising resistor 43 by-passed by condenser 44, across which a unidirectional voltage is developed. The unidirectional voltage across resistor 43 is applied to the input electrode of a cathode-ray tuning eye tube 36 through a filter comprising a series resistor 45 and a shunt condenser 46, the anode of tube 36 being connected directly to the common terminal of resistors 29 and 30 in the audio-frequency load circuit of detector 15. Auxiliary anode 47 is the target of tuning eye tube 36. Suitable operating potentials are provided in a conventional manner for the various tubes of the receiver through the terminals indicated as +Sc and +B.

In considering the operation of the arrangement just described, it will first be assumed that no signals of an appreciable amplitude are being received. Under these conditions the control grid of tuning-indicator tube 36 is substantially at ground potential, the resistance of the output circuit of the tuning-indicator tube is low, and a wide angle shadow is developed on the target of indicator tube 36 to show that the receiver is not tuned to a sending station. Under the conditions assumed, the conductance of tube 36 is high resulting in an appreciable voltage drop across resistor 30. It will be seen that this voltage across resistor 30 is effectively a bias upon the control grid of the triode section of the duplex tube 15 and that, under the conditions assumed, the triode section is effectively cut off and the receiver is silent. When the receiver is tuned to a signal of any usable strength, the intermediate-frequency carrier of the receiver is amplified by limiter-amplifier 37 and rectified in the diode section thereof to provide a control potential across load resistor 43 for the input circuit of tuning-indicator tube 36. For intermediate-frequency signals of any usable intensity, a relatively constant negative bias is thus applied to the control electrode of indicator tube 36 reducing the shadow angle of the tube to indicate that the receiver is correctly tuned and reducing the anode conductance of tube 36 to a minimum. Under this condition, the voltage drop across resistor 30, due to the output current of tube 36, is small and a normal operating bias is provided for the grid of duplex tube 15. Furthermore, it will be seen that, due to the delay bias developed across resistor 39, only the peaks of the voltage waves supplied by the selective circuit 41, 42 are effective to develop a voltage across resistor 43, thus causing the silencing means to be very sensitive to receiver mistuning. It will be understood that resistor 39 can be replaced by a separate source of bias potential without essentially altering the operation of the silencing means. The voltage developed across resistor 38' serves as a source of automatic ampification control potential and serves to maintain the intermediate-frequency signal input to the detector and to the limiter-amplifier 37 within a relatively narrow range for a wide variation of received signal intensities, while the limiter-amplifier 37, being effective to limit to a substantially constant value the maximum amplitude of signals translated thereby, is effective to derive an intermediate-frequency signal which is substantially free from residual variations in amplitude for rectification by the diode section of tube 37. The rectifier comprising the diode section of tube 37 being coupled to the limiter section of tube 37 by the tuned circuit 41, 42 sharply-selective to the carrier-frequency signal translated by the limiter-amplifier 37, its load circuit 43, 44 is effective to derive directly from the rectifier a unidirectional control voltage suitable for use as a silencing bias voltage.

It will be seen that the network just described provides a silencing potential for the receiver, there being substantially no reduction in the sensitivity of the receiver to signal carriers during the operation thereof. Furthermore, it will be seen that the circuit is very sensitive to mistuning, because of the operation of limiter-amplifier 37 and since it is responsive only to the peaks of the intermediate-frequency signals.

The embodiment of the invention shown in Fig. 2 is also utilized in a modulated-carrier signal receiver of the superheterodyne type and elements which are identical in the two figures have been given the same reference numerals. In the embodiment of the invention disclosed in Fig .2, the signal detector of the receiver comprises cathode 60 and diode-anode 61 of a duplex diode-pentode tube 62. Audio-frequency potentials are developed across series load resistor 63, by-passed for carrier-frequency currents by condenser 64, and are applied through a coupling condenser 65 to the control electrode of the pentode section of tube 62 utilized as an audio-frequency amplifier. The audio-frequency output of the pentode section of tube 62 is applied through condenser 66 to the control electrode of audio-frequency amplifier 67, the output circuit of audio-frequency amplifier 67 being coupled to loud-speaker 17 through a transformer 68, 69. Automatic amplification control potentials for the receiver are developed by means of a separate A. V. C. rectifier circuit comprising a cathode 60, diode-anode 70, and a shunt load circuit including resistors 71, 72, 73. Automatic amplification control potentials derived from load circuit 71, 72, 73 are applied over a circuit comprising resistor 74 to one or more of the tubes of amplifier 10, oscillator-modulator 13, and intermediate-frequency amplifier 14. A bias potential is provided for the control electrode of the pentode section of tube 62 through a circuit comprising resistors 75 and 73, resistor 73 being connected by way of resistors 72 and 76 to a suitable source of grid-bias potential indicated as —B in the drawing. Resistor 77 connected to source —B provides a bias potential for audio-frequency amplifier 67.

The operation of the portion of the receiver of Fig. 2 described above, which is conventional, will be apparent from the description which has been given with reference to the operation of the receiver of Fig. 1.

Coming now to the parts of the circuit of Fig. 2 comprising the present invention, the tuning eye tube 36 is connected in such manner as to amplify the unidirectional voltage across the load resistors of the automatic volume control source of bias potential, the input circuit of the indicator tube 36 being connected to resistor 74 through an audio-frequency filter comprising a series resistor 78 and a shunt condenser 79. The output circuit of indicator tube 36 is energized from the source +B through a load resistor 80 provided with an adjustable tap which is connected to the screen grid of the pentode section of tube 62 by way of a voltage divider comprising resistors 81 and 82. Resistor 82, connected between the screen grid of the pentode section of tube 62 and the negative terminal of the direct current supply —B, serves to stabilize the operation of the pentode secton of tube 62 and to permit a more complete silencing action. An intermediate-frequency by-pass condenser 83 is coupled between the anode of the pentode section of tube 62 and ground, while a load resistor 84 is connected between its anode and the source of direct current supply +B.

In considering the operation of the portion of the circuit of Fig. 2 comprising the present invention, it will first be assumed that no signals of an appreciable amplitude are being received. Under these conditions, as in the case of the circuit of Fig. 1, the control grid of the tuning indicator 36 is substantially at ground potential and the resistance of the output circuit of the indicator tube 36 is low, giving a wide angle shadow on its target 47 to show that the receiver is not tuned to a sending station. Under the conditions assumed, the anode conductance of tube 36 is high, resulting in an appreciable voltage drop across resistor 80. The voltage drop across the portion of resistor 80 between its tap and the source of direct current supply effectively reduces the voltage which is normally supplied to the screen grid of the pentode section of tube 62 which reduction effectively cuts off the tube and silences the receiver. When the receiver is tuned to a signal of any usable strength, the bias voltage developed in the automatic volume control system and applied to the control grid of tuning-indicator tube 36 reduces its anode conductance to a very low value. Under these conditions there is no appreciable voltage drop across resistor 80 due to the anode conductance of tube 36 and the screen potential of tube 62 is at its normal value and the received signals are reproduced by the loud-speaker of the receiver in a normal fashion.

It will be understood that the present invention can be utilized without the tuning indicator feature illustrated in each of the figures, a vacuum-tube amplifier of conventional type being utilized in place of tuning-indicator tube 36.

It will be understood that the current or voltage developed in the output circuit of tube 36, or preferably of a conventional amplifier tube used in place of tuning-indicator tube 36, as mentioned in the preceding paragraph, in either of the specific embodiments shown, can be utilized to operate any suitable relay in the signal-translating channel to silence the receiver. The use of an electromagnetic relay in the silencing circuit has the advantages that its operation is instantaneous during receiver tuning and, furthermore, that its characteristics can be so adjusted that the relay will not operate if the receiver is quickly tuned between two stations remote on the dial, the receiver being silent for all intermediate stations.

As illustrative of a specific embodiment of the invention, the following circuit constants are given for the embodiment of the invention shown in Fig. 2:

| | |
|---|---|
| Tube 62 | Type 6B8 |
| Tube 67 | Type 6K6G |
| Tube 36 | Type 6N5 |
| Resistor 63 | 0.5 megohm |
| Resistor 71 | 1 megohm |
| Resistor 75 | 1 megohm |
| Resistor 77 | 0.5 megohm |
| Resistor 80 | 0.5 megohm |
| Resistor 81 | 2 megohms |
| Resistor 82 | 2 megohms |
| Resistor 84 | 0.5 megohm |
| Source of direct current supply voltage | 140 volts (+B to ground) |
| Source of direct current supply voltage | 12 volts (ground to −B) |

While there have been described what are at present considered to be the preferred embodiments of the invention, it will be understood that various changes and modifications may be made therein without departing from the invention, and it is contemplated in the appended claims to cover all such changes and modifications as fall within the true spirit and scope of the invention.

What is claimed is:

1. A modulated-carrier signal receiver including a cathode-ray tuning indicator comprising a cathode, an anode, a control electrode and a target, an automatic amplification control system for said receiver for maintaining the signal amplitude at a given point of said receiver within relatively narrow limits, means comprising a limiter and rectifier including a sharply selective circuit coupled to said point for deriving therefrom a potential substantially free from residual variations in amplitude and applying it to said control electrode, a load circuit for said indicator, and means for deriving a voltage from said load circuit to silence said receiver.

2. A modulated-carrier signal receiver of the superheterodyne type including an automatic amplification control system for maintaining the signal amplitude at a given point in the intermediate-frequency channel of said receiver within relatively narrow limits, means comprising a limiter-amplifier coupled to said point for deriving a signal substantially free from residual variations in amplitude from the intermediate-frequency channel of said receiver, said limiter-amplifier including a sharply selective circuit tuned to the intermediate frequency and following the point at which limiting occurs, and means comprising a rectifier coupled to said limiter-amplifier for deriving a potential to silence said receiver.

3. A modulated-carrier signal receiver of the superheterodyne type including an automatic amplification control system for maintaining the signal amplitude at a given point in the intermediate-frequency channel of said receiver within relatively narrow limits, means comprising a limiter-amplifier coupled to said point for deriving a signal from the intermediate-frequency channel of said receiver substantially free from residual variations in amplitude, said limiter-amplifier including a sharply selective circuit tuned to the frequency of said intermediate-frequency channel and following the point at which limiting occurs, and means comprising a rectifier responsive only to the peaks of said derived signal for developing a control voltage to silence said receiver.

4. A modulated-carrier signal receiver of the superheterodyne type including an automatic amplification control system for maintaining the signal amplitude at a given point in the intermediate-frequency channel of said receiver within relatively narrow limits, means comprising a limiter-amplifier coupled to said point for deriving a signal from the intermediate-frequency channel of said receiver substantially free from residual variations in amplitude, said limiter-amplifier including a sharply selective circuit tuned to the frequency of said intermediate-frequency channel and following the point at which limiting occurs, means comprising a rectifier responsive only to the peaks of said derived signal for developing a control voltage, and a direct current amplifier tube comprising a cathode, an anode and a control electrode, means for applying said control voltage to said control electrode, and means responsive to the anode current of said direct current amplifier tube for silencing said receiver when said control voltage is below a predetermined value.

5. In a carrier-signal receiver, a control network comprising, means for receiving a carrier-frequency signal, an amplitude limiter for limiting to a substantially constant value the maximum amplitude of signals translated thereby, a rectifier, a circuit sharply-selective to said carrier-frequency signal and coupling said limiter to said rectifier, means for applying said carrier-frequency signal to said limiter and rectifier, means for deriving directly from said rectifier a unidirectional control voltage for said receiver which is substantially free from residual variations in amplitude, and means for utilizing said control voltage to control an operating characteristic of said receiver.

6. In a carrier-signal receiver including an automatic amplification control system for maintaining the signal amplitude at a given point within relatively narrow limits, a control network comprising, means for deriving from said given point a carrier-frequency signal of a predetermined frequency, an amplitude limiter for limiting to a substantially constant value the maximum amplitude of signals translated thereby, a rectifier, a circuit sharply-selective to said predetermined frequency and coupling said limiter to said rectifier, means for applying said control signal to said limiter and rectifier, means for deriving directly from said rectifier a unidirectional control voltage for said receiver which is substantially free from residual variations in amplitude, and means for utilizing said control voltage to control an operating characteristic of said receiver.

7. In a carrier-signal receiver, a control network comprising, means for receiving a carrier-frequency signal, an amplitude limiter for limiting to a substantially constant value the maximum amplitude of signals translated thereby, a rectifier, a circuit sharply-selective to said carrier-frequency signal and coupling said limiter to said rectifier, means for applying said carrier-frequency signal to said limiter and rectifier, means for limiting the operation of said rectifier to derive directly from said rectifier a unidirectional control voltage for said receiver responsive only to the peaks of the limited and selected signal which is substantially free from residual variations in amplitude, and means for utilizing said control voltage to control an operating characteristic of said receiver.

8. In a carrier-signal receiver, a control network comprising, means for receiving a carrier-frequency signal, an amplitude limiter for limiting to a substantially constant value the maximum amplitude of signals translated thereby, a rectifier, a circuit sharply-selective to said carrier frequency and coupling said limiter to said rectifier, means for applying said control signal to said limiter and rectifier, means including an amplitude delay bias for said rectifier to limit the effective operation thereof only to the peaks of said carrier-frequency signal for deriving directly from said rectifier a unidirectional control voltage for said receiver responsive only to the peaks of said carrier-frequency signal and which is substantially free from residual variations in amplitude, and means for utilizing said control voltage to control an operating characteristic of said receiver.

NELSON P. CASE.